United States Patent [19]

Zhu

[11] Patent Number: 5,777,276
[45] Date of Patent: Jul. 7, 1998

[54] MOTHER BOARD WITH AUXILIARY CONDUCTORS IN PARALLEL WITH POWER CONNECTORS

[75] Inventor: Xiao Feng Zhu, Fremont, Calif.

[73] Assignee: Micronics Computers Inc., Fremont, Calif.

[21] Appl. No.: 686,552

[22] Filed: Jul. 26, 1996

[51] Int. Cl.$^6$ .................................................. H01R 9/09
[52] U.S. Cl. ........................... 174/263; 361/792; 257/700
[58] Field of Search ................................ 257/698, 700, 257/691; 333/245, 246, 247, 260; 174/261, 262, 263, 264, 265, 266, 267; 361/744, 780, 791, 792, 794

[56] References Cited

U.S. PATENT DOCUMENTS

| | | | |
|---|---|---|---|
| 4,987,393 | 1/1991 | Yorita et al. | 333/202 |
| 5,102,352 | 4/1992 | Arisaka | 439/608 |
| 5,150,089 | 9/1992 | Komazaki et al. | 333/206 |
| 5,202,752 | 4/1993 | Honjo | 257/678 |
| 5,333,095 | 7/1994 | Stevenson et al. | 361/302 |
| 5,538,433 | 7/1996 | Arisaka | 439/70 |

Primary Examiner—Hyung S. Sough
Assistant Examiner—Dhiru R. Patel
Attorney, Agent, or Firm—Paul Hentzel

[57] ABSTRACT

Motherboard 10M receives a voltage at post 14P from an off-board power source. Buried conductive layer 10B selectively distributes this electrical power to component sites 10S. Post bore 14 penetrates through local electrodes 12U and 12L into the motherboard for exposing post contact regions 14U and 14L and post contact region 14B in the buried layer. Connector post 14P is positioned within the post bore. Post bore conductor 14C within the post bore establishes electrical continuity from the connector post to the buried layer. The post bore conductor also establishes electrical continuity from the connector post to post contact regions 14U and 14L in the local electrodes. Auxiliary bore 16 proximate the post bore penetrates into the motherboard for exposing auxiliary contact regions 16U and 16L in the local electrodes, and auxiliary contact region 16B in the buried layer. Auxiliary bore conductor 16C within the auxiliary bore establishes electrical continuity along the auxiliary bore. Each auxiliary bore provides an upper circuit and lower auxiliary circuit in parallel relationship between the connector post and the buried layer for reducing the electrical resistance into the buried layer from the off-board power supply.

19 Claims, 3 Drawing Sheets

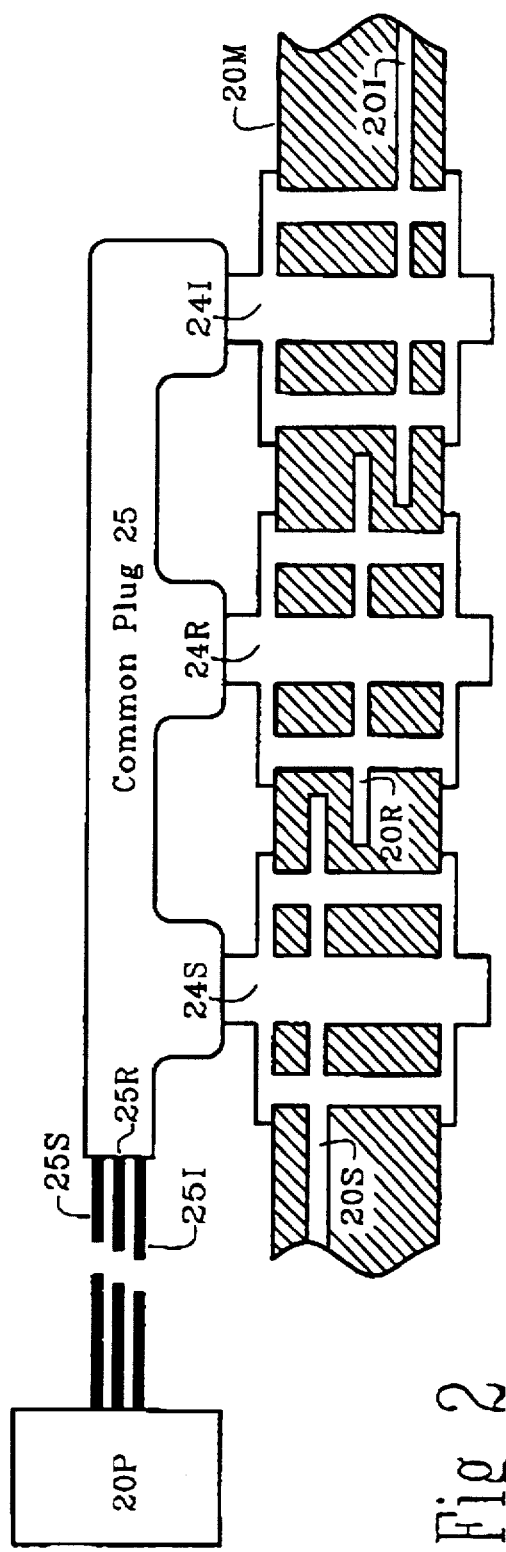
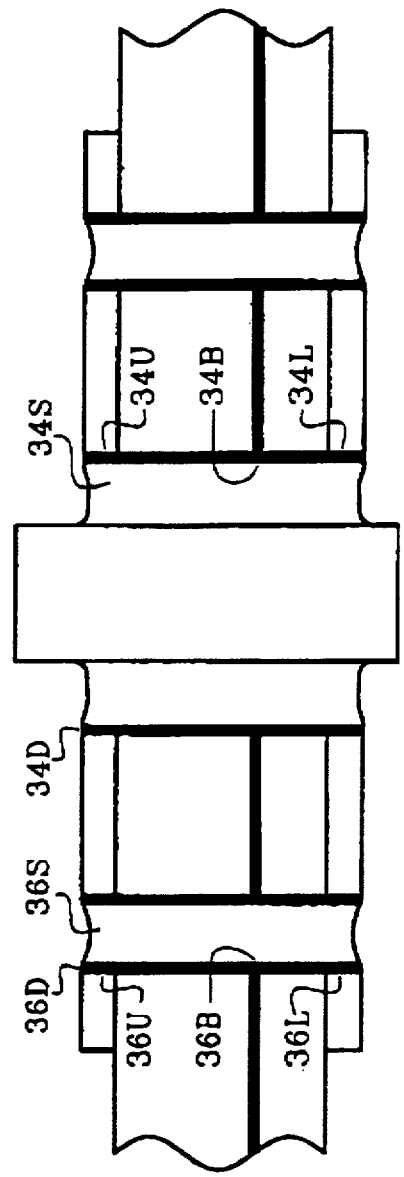
Fig 2
Fig 3

MOTHER BOARD WITH AUXILIARY CONDUCTORS IN PARALLEL WITH POWER CONNECTORS

TECHNICAL FIELD

This invention relates to providing operating current to a buried layer within a motherboard, and more particularly to reducing the input resistance of such current by employing auxiliary conductors in parallel with the a power connector post for the buried layer.

BACKGROUND

In modern computers, the Vcc voltage (+5 volts) is commonly supplied to a Vcc buss layer buried in the motherboard from an on-board connector post sold mounted on the motherboard. A Vcc power lead extends from the Vcc terminal on an off-board power supply to the on-board Vcc post. The conductive interface between the solder post and the buried layer is limited to a buried band region of contact. Other operating voltages (including ground) are similarly distributed from a power supply terminal to a buried layer through a band contact region.

All electrical power into the motherboard circuits must pass through these buried band contacts. Recent computer designs employ vastly extended memories operating a very high speeds which require more current. The motherboard current requirements are highest during the power-up cycle (about 2 seconds) and during peak number crunching activities. Presently, a pair of Pentium chips consumes about 70 watts average requiring a current of about 7 amperes per chip. Ohmic losses across the band contact diminish the Vcc supply available to the motherboard circuits. On-board surge capacitors have been employed to maintain an adequate Vcc level during the power-up cycle.

SUMMARY

It is therefore an object of this invention to provide an auxiliary conductor system which reduces the electrical input resistance of operating current into a buried layer in a motherboard.

It is another object of this invention to provide such a system which tolerants variations in the resistance across the band contacts.

Briefly, these and other objects of the present invention are accomplished by providing a motherboard having an off-board power source. A monolithic conductive layer buried between the upper surface and the lower surface of the motherboard, selectively extends throughout the motherboard for selectively distributing electrical power to component sites on the motherboard. Local electrodes are formed on at least one surface of the motherboard. A post bore penetrates through the local electrode into the motherboard for exposing a small post contact region in the local electrode. The post bore penetrates further into the motherboard for exposing a small post contact region in the buried layer. A connector post is positioned within the post bore for connection to the off-board power source. A post bore conductor within the post bore establishes electrical continuity between the connector post and the small post contact region in the buried layer defining a post electric circuit from the connector post to the buried layer. The post bore conductor also establishes electrical continuity between the connector post and the small post contact region in the local electrode. At least one auxiliary bore proximate the post bore also penetrates through the local electrode into the motherboard for exposing a small auxiliary contact region in the local electrode. The auxiliary bore penetrates further into the motherboard for exposing a small auxiliary contact region in the buried layer. An auxiliary bore conductor within the auxiliary bore establishes electrical continuity along the auxiliary bore from the small auxiliary contact region in the local electrode to the small auxiliary contact region in the buried layer. The local electrode is in series with the auxiliary bore conductor defining an auxiliary electric circuit from the connector post to the buried layer. The post electric circuit and the auxiliary electric circuit are in parallel relationship between the connector post and the buried layer for reducing the electrical resistance into the motherboard from the off-board power supply.

BRIEF DESCRIPTION OF THE DRAWING

Further objects and advantages of the auxiliary conductor system and the operation of the parallel circuits will become apparent from the following detailed description and drawing (not drawn to scale) in which:

FIG. 2 is a sectional view of a multiple buried layer embodiment of an auxiliary system for receiving multiple voltages from a power supply;

FIG. 3 is a sectional view of an auxiliary conductor system showing the conductive material in the post bore and in the auxiliary conductors;

Figure 1:
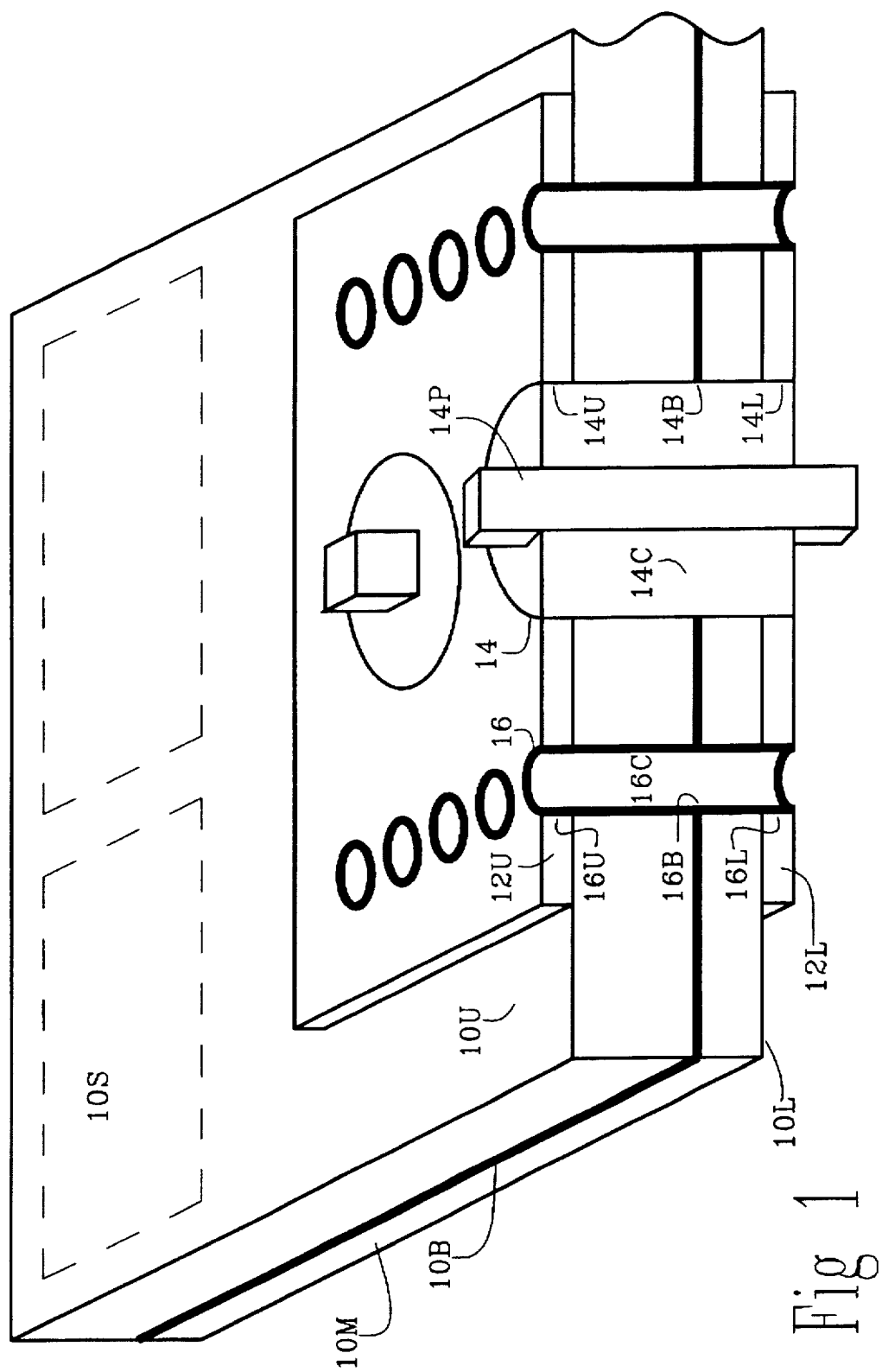
FIG. 1 is an isometric view of an auxiliary conductor system in section showing the post bore, the auxiliary bores and the buried layer.

The first digit of each reference numeral in the above figures indicates the figure in which that element is most prominently shown. The second digit indicates related structural elements, and a final letter (when used) indicates a sub-portion of an element.

GENERAL EMBODIMENT (FIG. 1)

Motherboard 10M for mounting within a computer apparatus receives an operating voltage at power connector post 14P from an off-board power source. Monolithic conductive layer 10B buried between upper surface 10U and lower surface 10L of the motherboard, selectively extends throughout the motherboard for selectively distributing electrical power to component sites 10S (shown in dash) on the motherboard. Local electrodes 12U and 12L are formed on the upper and lower surfaces of the motherboard. Post bore 14 penetrates through the local electrodes into the motherboard for exposing small post contact regions 14U and 14L in the local electrodes. The post bore also exposes small post contact region 14B in the buried layer. Connector post 14P is positioned within the post bore. Post bore conductor 14C within the post bore establishes electrical continuity between the connector post and post contact region 14B in the buried layer, defining a post electric circuit from the connector post to the buried layer. The post bore conductor also establishes electrical continuity between the connector post and post contact regions 14U and 14L in the local electrodes.

Auxiliary bore 16 proximate the post bore penetrates through the local electrodes for exposing small auxiliary contact regions 16U and 16L in the local electrodes, and penetrating further into the motherboard for exposing small auxiliary contact region 16B in the buried layer. Auxiliary bore conductor 16C within the auxiliary bore establishes electrical continuity along the auxiliary bore from upper auxiliary contact region 16U to auxiliary contact region 16B in the buried layer. The upper local electrode is in series with the auxiliary bore conductor defining an upper auxiliary electric circuit from the connector post to the buried layer. The auxiliary bore conductor also establishes electrical continuity from lower auxiliary contact region 16L to auxiliary contact region 16B. The lower local electrode is also in series with the auxiliary bore conductor defining a lower auxiliary electric circuit from the connector post to the buried layer. Each auxiliary bore provides two auxiliary electric circuits, an upper circuit and a lower circuit. The post electric circuit and the upper and lower auxiliary electric circuits are in parallel relationship between the connector post and the buried layer for reducing the electrical resistance into the buried layer from the off-board power supply.

In the embodiment of FIG. 1, both the post bore and the auxiliary bores are round bores extending completely through the motherboard from upper local electrode 12U to lower local electrode 12L. The connector post extends out of the post bore into the space above the post bore and below the post bore. The contact regions exposed in the local electrodes and in the buried layer are band regions of contact around the side walls of the bores. Each contact region has the same radius as the bore which exposes that contact region. The local electrode contract regions have a width equal to the thickness of the local electrode; and the buried layer contract regions have a width equal to the thickness of the buried layer. The area of each contact regions is Pi times the width "w" times twice the radius "r" of the bore:

Band Area=(Pi)(w)(2r).

The motherboard may have a plurality of auxiliary bores exposing multiple sets of auxiliary contact regions in the local electrodes and buried layer. In addition, the motherboard may also have a plurality of post bores, exposing multiple sets of post contact regions in the local electrodes and buried layer.

FIG. 1 shows an auxiliary conductor system with two post bores and 12 auxiliary bores, six auxiliary bores for each post bore. The two auxiliary bores closest to the viewer are on the viewer's side of the section plane and are not shown in FIG. 1. Both of the post bores have a connector post and a post bore conductor forming two post electric circuits in parallel. Each auxiliary bore and has an auxiliary bore conductor therein making electrical contact with the local electrodes and the buried layer. The 12 auxiliary bores and auxiliary conductors establish 24 auxiliary electric circuits (12 upper and 12 lower), in parallel with the two post electrical circuits. This plurality of auxiliary conductors and post conductors further reduces the electrical resistance into the buried layer from the off-board power supply.

SYSTEM EMBODIMENT (FIG. 2)

Motherboard 20M may have a plurality of independent buried layers 20S, 20R, and 20I for distributing operating voltages and providing buried routing traces for electrical signals as shown in FIG. 2. Each buried layer has its own pair of upper and lower local electrodes with auxiliary bores and at least one post bore. Each post bore has a post connector and a post bore conductor, and each auxiliary bore has an auxiliary bore conductor. The local electrodes are preferably small, just large enough to contain the post bore and auxiliary bores. Small local electrodes conserve valuable space on the surface of the motherboard.

Buried layer 20S is a buried supply buss having supply post connector 24S with supply lead 25S for connection to a supply terminal on off board power supply 20P. A common supply voltage the +5 volts Vcc. Buried layer 20R is a buried return buss having return post connector 24R with return lead 25R for connection to a return terminal on the off board power supply to receive a return voltage such as ground Vss. Buried layer 20I is an intermediate buss having an intermediate post connector 24I with intermediate lead 25I for connection to an intermediate terminal on the off board power supply. A common intermediate voltage is 3.3 volts Vcc3 Preferably the post connectors are in closely adjacent positions on motherboard for convenient harnessing into common power plug 25. The buried busses may be thin layers of copper about 1.5 mils thick, formed by photo-masking techniques. A motherboard is typically about 77 mils, and may include many buried layers. A series of interrelated masks provide staggered buried layer positions which permit the post bores and auxiliary bores for each buried layer to intercept their own buried layer while missing the other buried layers.

BORE CONDUCTORS (FIGS. 1 and 3)

Auxiliary bore conductor 16C may be formed by a conductive material such as copper layer deposited over auxiliary contact regions 16U, 16B and 16L, and along the sidewall of the auxiliary bore between the auxiliary contact regions. The auxiliary bore conductor may be just a sleeve of copper with a hollow core as shown in the embodiment of FIG. 1. Alternatively, the auxiliary bore conductor may include inner conductive solder material 36S filling the auxiliary bore over deposited copper material 36D as shown in the simplified embodiment of FIG. 3. The auxiliary bores are typically about 16 mils in diameter, with a 1.5 mil copper deposit formed by electro-plating techniques. The inner solder material is than a solid core about 13 mils in diameter which may be formed by wave soldering along the surface of the motherboard.

Post bore conductor 14C may be a conductive solder material filling the post bore between the connector post and the sidewalls of the post bore, and electrically connecting the connector post to post contact regions 14U, 14B, and 14L as shown in the embodiment of FIG. 1. The post bores are typically about 60 mils in diameter, slightly larger than the connector posts. The solder material fills the interstitial space between the sidewall and the connector post for providing electrical continuity and for supporting the connector post. Alternatively, the post bore conductor may include a layer of conductive material 34D around solder material 34S as shown in the embodiment of FIG. 3. Layer 34D may also be copper deposited over the post contact regions and along the sidewall of the post bore therebetween at a thickness of about 1.5 mils.

Post bore conductor 34D forms an electrically conductive upper bridge 34U between the connector post and the exposed post contact region in the upper local electrode as part of the upper auxiliary electric circuit to the buried layer. The post bore conductor also forms buried conductive bridge 34B between the connector post and the exposed post contact region in the buried layer as part of the post electric circuit to the buried layer. The post bore conductor forms lower conductive bridge 34L between the connector post and the exposed post contact region in the lower local electrode as part of the Lower auxiliary electric circuit to the buried layer.

Auxiliary bore conductive material 36D forms an electrically conductive upper bridge 36U to the exposed auxiliary contact region in the upper local electrode as part of the upper auxiliary electric circuit to the buried layer. The auxiliary bore conductor also forms buried conductive bridge 36B to the exposed auxiliary contact region in the buried layer as part of the auxiliary electric circuit to the buried layer. The auxiliary bore conductor forms lower conductive bridge 36L to the exposed auxiliary contact region in the lower local electrode as part of the lower auxiliary electric circuit to the buried layer.

EQUIVALENT CIRCUIT DIAGRAM (FIG. 4)

Figure 4:
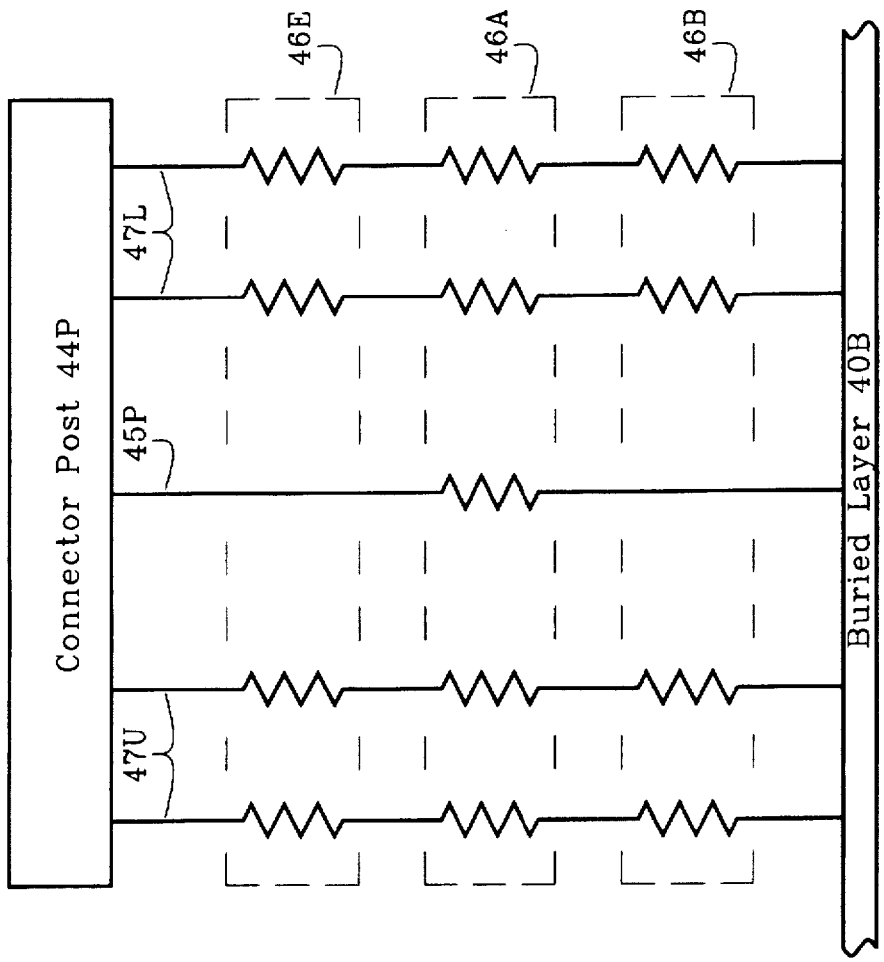
FIG. 4 is an equivalent circuit of an auxiliary conductor system showing four auxiliary electric circuits in parallel with a single post electric circuit.

The equivalent circuit diagram of FIG. 4 represents a simplified auxiliary conductor system similar to the system of FIG. 3, having:

- one power connector post 44P (extending horizontally along the top of the circuit),
- one buried layer 40B (extending horizontally along the bottom of the circuit),
- one post electric circuit 45P (extending vertically in the middle of the circuit),
- two upper auxiliary electric circuits 47U (lefthand side of the circuit), and
- two lower auxiliary electric circuits 47L (righthand side of the circuit).

Each of the four auxiliary electric circuits includes three resistors, and the post electric circuit has only a single resistor. The 13 resistors represent the minimal but finite resistance of the bridge interfaces between the bore conductive material and the band contact regions. The bridge resistance is caused by the imperfect atomic interface between the bore conductor atoms and the buried layer atoms. High resistance flaws and voids form during the copper deposition and solder flow. While the overall resistance of each bridge is very small, the resistance is larger than the nearly zero resistance of the connector post, local electrodes, auxiliary conductors, and the buried layer. The atomic interface along these zero resistance elements is generally flawless and without voids due to the higher quality molecular intimacy established within the deposited copper and the solder melt. In ordinary circuit analysis, these bridge resistances may be ignored. However in view of the heavy power current into the motherboard (possible as high as seven amperes per pentium chip), the bridge resistances need to be considered. The RxI loss across each bridge is higher at higher currents and subtracts more from the power voltages.

The post-to-electrode bridge resistances of the four auxiliary electric circuits are in upper row 46B (box in dash lines) just under connector post 44P. The electrode-to-auxiliary bridge resistances are in middle row 46A (dash box). The auxiliary-to-buried bridge resistances are in lower row 46B (dash box) just above buried layer 40B. The equivalent circuit has one post electric circuit 45P formed by the post-to-buried bridge resistance, and the four auxiliary electric circuits are each formed by three resistors in series. For purposes of this equivalent circuit, all of the resistances are assumed to be equal, having a unit resistance R. Further the electrical resistance of connector post 44P, the local electrodes, the auxiliary conductors, and buried layer 40B, are assumed to be zero.

The two upper auxiliary electric circuits 47U form parallel branches of three 1 R resistances each, which combine into a single upper resistance of 1.5 R. The two lower auxiliary electric circuits 47L likewise combine into a single lower resistance of 1.5 R. The upper and lower resistances further combine into a single branch of ¾ R in parallel with the single post electric circuit resistance of R. Finally the equivalent resistance of the four auxiliary conductor system combined with the single post electric circuit of 1 R is 3/7 R, less than one half the resistance of the post electric circuit alone. Auxiliary conductor systems with more than four auxiliary electric circuits, such as the FIG. 1 system, have an even lower combined resistance.

The actual resistance of each interface bridge may vary from unit value R because of variations in the purity of material stock, solder temperature, and other manufacturing conditions. However, the parallel feature of the auxiliary conductor system reduces the impact of these variations. For example in a worst case "cold solder" scenario, one of the bridge interfaces may be a complete void forming an open circuit of infinite resistance. The parallel relationship of the remaining three auxiliary electric circuits of FIG. 4 maintains the total resistance of the auxiliary conductor system to ½ R, only slightly higher than 3/7 R.

Figure 5:
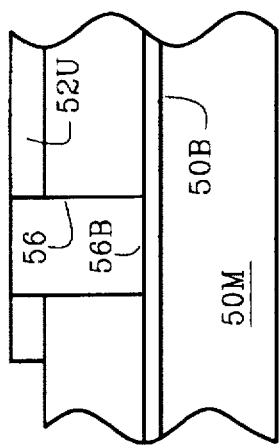
FIGS. 5 and 6 are sectional views of blind auxiliary bores with expanded contact regions.
Figure 6:
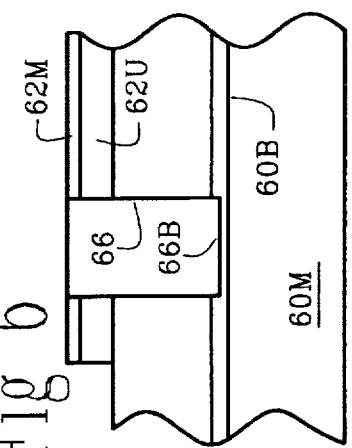

BORE DEPTH (FIGS. 5 and 6)

The auxiliary bore may be a blind bore which does not extend completely through the motherboard as shown in the embodiment of FIG. 1. The bores may be formed by suitable boring technique such as mechanical removal by rotating bits, or vaporization by laser energy and electron beams. Non-round bores may be formed by shaping the cross-section of the beam. Tilted bores may be employed to increase the band contact area. The depth of the bores may be controlled to provide blind bores reaching buried layers at various depths.

Auxiliary bore 56 penetrates through local electrode 52U into motherboard 50M to buried layer 50B without penetrating into the buried layer as shown in FIG. 5. Auxiliary bore 56 exposes contact region 56B in the buried layer at the bottom of the auxiliary bore. Contact region 56B is not a band shaped region having a width limited to the thickness of the buried layer, as shown in the embodiment of FIG. 1. The area of contract region 56B is equal to the cross-sectional area of the auxiliary bore. More particularly:

Area 56B=(Pi)(r)(r), which is many times greater than the band shaped contact region:

Band Area=(Pi)(w)(2r), because radius "r" in much larger than width "w". In addition, blind bores require less material to be removed from the motherboard than complete bores, resulting in a savings in boring energy and boring time.

Auxiliary bore 66 penetrates through local electrode 62U into motherboard 60M, and slightly furthe r into buried layer 60B still without penetrating the buried layer as shown in FIG. 6. Auxiliary bore 66 exposes contact region 66B in buried layer 60B at the bottom of the auxiliary bore plus a partial sidewall band of buried layer exposure. The local electrodes may be covered with an electrically insulating material such as solder mask 62M.

CONCLUSION

It will be apparent to those skilled in the art that the objects of this invention have been achieved as described hereinbefore. Clearly various changes may be made in the structure and embodiments shown herein without departing from the concept of the invention. Further, features of the embodiments shown in the various figures may be employed with the embodiments of the other figures. Therefore, the scope of the invention is to be determined by the terminology of the following claims and the legal equivalents thereof.

I claim as my invention:

1. A motherboard for mounting within a computer apparatus having an off-board power source, comprising:

a monolithic conductive layer buried within the motherboard between the upper surface and the lower surface thereof, and selectively extending throughout the motherboard for selectively distributing electrical power to component sites on the motherboard;

local electrode means on at least one surface of the motherboard;

a post bore penetrating through the local electrode means into the motherboard for exposing a small post contact region in the local electrode means, and penetrating further into the motherboard for exposing a small post contact region in the buried layer, the penetration of the post bore forming a side wall along the post bore;

a connector post positioned within the post bore for connection to the off-board power source;

post bore conductor means within the post bore for establishing electrical continuity between the connector post and the small post contact region in the buried layer defining a post electric circuit from the connector post to the buried layer, and for establishing electrical continuity between the connector post and the small post contact region in the local electrode means and establishing an electrical resistance into the motherboard from the off-board power source;

at least one auxiliary bore proximate the post bore penetrating through the local electrode means into the motherboard for exposing a small auxiliary contact region in the local electrode means, and penetrating further into the motherboard for exposing a small auxiliary contact region in the buried layer, the penetration of the auxiliary bore forming a side wall along the auxiliary bore;

an auxiliary bore conductor means within the auxiliary bore for establishing electrical continuity along the auxiliary bore from the small auxiliary contact region in the local electrode means to the small auxiliary contact region in the buried layer, the local electrode means in series with the auxiliary bore conductor means defining an auxiliary electric circuit from the connector post to the buried layer;

the post electric circuit and the auxiliary electric circuit in parallel relationship between the connector post and the buried layer for reducing the electrical resistance into the motherboard from the off-board power supply.

2. The motherboard of claim 1, wherein the post bore extends completely through the motherboard from the upper surface thereof to the lower surface thereof, and the post contact region exposed in the local electrode and in the buried layer are band regions of contact along the side wall of the post bore.

3. The motherboard of claim 2, wherein the auxiliary bore extends completely through the motherboard from the upper surface thereof to the lower surface thereof, and the auxiliary contact region exposed in the local electrode and in the buried layer are band regions of contact along the side wall of the auxiliary bore.

4. The motherboard of claim 3, wherein the local electrode means comprises:

an upper local electrode on the upper surface of the motherboard forming part of an upper auxiliary electric circuit, and a lower local electrode on the lower surface of the motherboard forming part of a lower auxiliary electric circuit.

5. The motherboard of claim 4, wherein the post bore conductor means forms an electrically conductive upper solder bridge between the connector post and the post contact region exposed in the upper local electrode as part of the upper auxiliary electric circuit to the buried layer, and forms an electrically conductive buried solder bridge between the connector post and the post contact region exposed in the buried layer as part of the post electric circuit to the buried layer, and forms an electrically conductive lower solder bridge between the connector post and the post contact region exposed in the lower local electrode as part of the lower auxiliary electric circuit to the buried layer.

6. The motherboard of claim 4, wherein the auxiliary bore conductor means forms an electrically conductive upper solder bridge to the auxiliary contact region exposed in the upper local electrode as part of the upper auxiliary electric circuit to the buried layer, and forms an electrically conductive buried solder bridge to the auxiliary contact region exposed in the buried layer as part of the auxiliary electric circuit to the buried layer, and forms an electrically conductive lower solder bridge to the auxiliary contact region exposed in the lower local electrode as part of the lower auxiliary electric circuit to the buried layer.

7. The motherboard of claim 2, wherein the connector post extends out of the post bore into a space above the post bore and below the post bore.

8. The motherboard of claim 1, wherein the auxiliary bore conductor means is formed by an auxiliary conductive material deposited over the auxiliary contact regions and along the sidewall of the auxiliary bore between the auxiliary contact regions.

9. The motherboard of claim 8, wherein the post bore conductor means is formed by a post conductive solder material filling the post bore between the connector post and the sidewalls of the post bore, and electrically connecting the connector post to the post contact regions.

10. The motherboard of claim 9, wherein the post bore conductor means further comprises a post conductive material deposited over the post contact regions and along the sidewall of the post bore between the post contact regions.

11. The motherboard of claim 10 wherein the auxiliary bore conductor means further comprises an auxiliary conductive solder material filling the auxiliary bore over the deposited conductive material.

12. The motherboard of claim 1, wherein the local electrode means is a single electrode on one surface of the motherboard, and the auxiliary bore penetrates through the local electrode into the motherboard to the buried layer without penetrating the buried layer for exposing a contact region on the buried layer at the bottom of the auxiliary bore equal to the cross sectional area of the auxiliary bore.

13. The motherboard of claim 1, wherein the local electrode means is a single electrode on one surface of the motherboard, and the auxiliary bore penetrates through the local electrode into the motherboard and slightly into the buried layer without penetrating the buried layer for exposing a contact region on the buried layer at the bottom of the auxiliary bore equal to the cross sectional area of the auxiliary bore plus a sidewall band of buried layer exposure.

14. The motherboard of claim 1, further comprising:

a plurality of auxiliary bores, penetrating through the local electrode means into the motherboard for exposing multiple auxiliary contact regions in the local electrode means and in the buried layer; and a plurality of auxiliary bore conductor means, one within each auxiliary bore to establish a plurality of auxiliary electric circuits in parallel with the post electrical circuit for further reducing the electrical resistance into the motherboard from the off-board power supply.

15. The motherboard of claim 14, further comprising:

a plurality of post bores, penetrating through the local electrode means into the motherboard for exposing multiple post contact regions in the local electrode means and in the buried layer;

a plurality of post bores, one within each post bore; and a plurality of post bore conductor means, one within each post bore to establish a plurality of post electric circuits in parallel with the plurality of auxiliary electrical circuits for even further reducing the electrical resistance into the motherboard from the off-board power supply.

16. The motherboard of claim 1, further comprising a plurality of additional buried layers, each additional buried layer having a local electrode means, and a post bore with a post connector and a post bore conductor means therein, and an auxiliary bore with an auxiliary bore conductor means therein, which form a post electric circuit and an auxiliary electric circuit connected in parallel for each buried layer.

17. The motherboard of claim 16, wherein one of the additional buried layers is a supply buried layer having a supply post connector for connection to a supply terminal on the off board power supply for receiving a supply voltage.

18. The motherboard of claim 17, wherein another one of the additional buried layers is a return buried layer having a return post connector for connection to a return terminal on the off board power supply for receiving a return voltage.

19. The motherboard of claim 18, wherein another one of the additional buried layers is an intermediate buried layer having an intermediate post connector for connection to an intermediate terminal on the off board power supply for receiving an intermediate voltage.

* * * * *